(12) United States Patent
Lantsman

(10) Patent No.: US 6,190,512 B1
(45) Date of Patent: Feb. 20, 2001

(54) SOFT PLASMA IGNITION IN PLASMA PROCESSING CHAMBERS

(75) Inventor: Alexander D. Lantsman, Middletown, NY (US)

(73) Assignee: Tokyo Electron Arizona Inc., Tokyo (JP)

(*) Notice: Under 35 U.S.C. 154(b), the term of this patent shall be extended for 0 days.

(21) Appl. No.: 08/117,443

(22) Filed: Sep. 7, 1993

(51) Int. Cl.⁷ .................................................. C23C 14/34
(52) U.S. Cl. ................................ 204/192.12; 204/192.13
(58) Field of Search ................................ 156/643, 646, 156/626, 627, 345; 204/192.12, 192.13, 298.08, 298.06, 298.34, 298.32, 192.33; 219/121.57; 118/723 R, 723 E

(56) References Cited

U.S. PATENT DOCUMENTS

| | | | |
|---|---|---|---|
| 4,557,819 | * 12/1985 | Meacham et al. | 204/298 |
| 4,888,088 | * 12/1989 | Slomowitz | 156/643 |
| 5,288,971 | * 2/1994 | Knipp | 204/298.08 X |

FOREIGN PATENT DOCUMENTS 59-222580   12/1984   (JP) ............................... C23C/15/00

OTHER PUBLICATIONS

Mashiro Kazuhiko, "Discharge Triggering Method of Sputtering Device" Abstracts of Japanese Patent Application No. 59–222580, Published December 14, 1984.

Jeff Rowland, "Equipment Profile—Coherence One Series II Preamp and Model 7 Mono Amp" Audio Magazine, Apr., 1990.

Audio Research Corporation, Product Brochure D70/D115/D250 and M100 Power Amplifiers.

"Gaseous Conductors Theory and Engineering Applications" James Dillon Cobine, Ph.D. (1941, 1958).

"The Advanced Energy MDX Magnetron Drive" Sales Brochure of Advanced Energy Industries, Inc. (Jun., 1991).

* cited by examiner

Primary Examiner—Nam Nguyen
(74) Attorney, Agent, or Firm—Wood, Herron & Evans, L.L.P.

(57) ABSTRACT

The specification discloses a power supply circuit which reduces oscillations generated upon ignition of a plasma within a processing chamber. A secondary power supply pre-ignites the plasma by driving the cathode to a process initiation voltage. Thereafter, a primary power supply electrically drives the cathode to generate plasma current and deposition on a wafer.

7 Claims, 3 Drawing Sheets

SOFT PLASMA IGNITION IN PLASMA PROCESSING CHAMBERS

BACKGROUND OF THE INVENTION

This invention relates to reduction of device damage in plasma processes, including DC (magnetron or non-magnetron) sputtering, and RF sputtering.

A typical plasma processing apparatus is shown in FIG. 1. The apparatus includes a plasma power supply 10, which drives a cathode or target 12 to a large DC voltage (e.g., −400 Volts) relative to the walls of vacuum chamber 14. The semiconductor substrate 16 (also known as the wafer) rests on a back plane 18 inside the chamber. The back plane may be driven by radio frequency (RF) AC voltage signals, produced by an RF power supply 20, which drives the back plane through a compensating network 22.

The AC and/or DC power supplies generate a plasma in the area above the wafer and between the wafer and the target, and cause material from the target to deposit on the wafer surface.

A typical DC power supply 10 includes a relatively sophisticated control system, designed to permit operation in constant power, constant voltage, or constant current modes. This control circuitry includes a damped control loop which, when the supply is engaged, produces a controlled ramping toward the desired output level. For example, as shown in FIG. 2, upon engagement of a typical DC power supply in an apparatus as shown in FIG. 1, the supply current (which represents the density of ionic transfer from the target due to sputter deposition on the wafer) ramps up to a constant value in a controlled manner with a small overshoot 24.

Despite the otherwise carefully regulated output produced by typical power supplies, it is normal to observe a spike in the target voltage during process initiation. As shown in FIG. 3, the magnitude of the spike 26 at process initiation may exceed the normal DC voltage level by a factor of 2 or more (e.g., those shown in FIG. 3 reach −1100 Volts). This phenomenon, known as the "break down" spike, is typically viewed as a necessary, isolated event associated with the creation of a plasma in the chamber 14 (otherwise known as "plasma ignition"). Furthermore, a large magnitude break down spike has been seen as necessary to improve process quality.

SUMMARY OF THE INVENTION

Overvoltage in the processing chamber deteriorates the quality of sputtered films in several ways: High voltage events electrically damage layers and/or devices on the processing substrate (wafer). Furthermore, arcing which can be produced by overvoltages can cause local overheating of the target, leading to evaporation or flaking of target material into the processing chamber and causing substrate particle contamination and device damage. These sources of wafer damage become increasingly significant as integrated circuits reach higher densities and become more complex. Thus, it is advantageous to avoid voltage spikes during processing wherever possible.

With this in mind, careful analysis has revealed that the so-called break down spike is not, in fact, an isolated event necessarily associated with the creation of a plasma in the chamber. The spike is not caused by the creation of a plasma per se, but rather by harmonic oscillations within the chamber.

As shown in FIG. 4, a gas-filled chamber generates sizable oscillations when driven by a DC voltage within a given voltage range. These oscillations are evident in regions 26 and 28. Notably, however, the oscillations cease when the driving voltage exceeds a threshold voltage represented by line 30. One explanation of this phenomenon is that complete plasma ignition occurs above threshold voltage 30. When the power supply voltage is near to, but below this threshold voltage, unstable gas discharges, as well as related transitions between gas and plasma phases, occur in chamber 14. (Similar effects have been observed in gaseous-discharge tubes.) As a result, the gas-plasma system begins unstable oscillation, producing brief, but very large magnitude voltage perturbations. This oscillation continues until the threshold voltage 30 is achieved, at which point the gas/plasma mixture fully transitions to a plasma, and oscillations cease.

Voltage 30 will be referred to as the "oscillation threshold voltage". The value of the oscillation threshold voltage will depend on the target (cathode) material, process gas and pressure, chamber geometry, electrical characteristics of the external power wiring, and possibly the volt-ampere curve of the sputtering chamber.

Based on the preceding observations, the spike observed in region 26 of FIG. 3 is now understood to be an oscillation caused when the output voltage of primary supply 10 lingers at a voltage just below the oscillation threshold. Furthermore, careful inspection of region 28 of FIG. 3 also reveals oscillatory behaviors analogous to those which appear in region 28 of FIG. 4. (The oscillations in region 28 have smaller magnitudes, in part because when the power supply is disabled, its output voltage drops relatively rapidly, whereas when the power supply is enabled its output voltage increases relatively slowly.)

It has been found that the oscillation spike observed in FIG. 3 can be eliminated by elevating the target/cathode voltage above the oscillation threshold voltage before initiating gas flow into the chamber, and maintaining the cathode voltage above the oscillation threshold until processing is completed, gas flow is halted, and vacuum is restored. This technique prevents overvoltage during processing, and therefore can reduce device damage and particulate contamination.

In brief summary, this technique is implemented by a power supply circuit comprising two power supply sections: an essentially conventional primary power supply, which provides the primary power to electrically drive the cathode during the plasma process, and a secondary power supply which supplies an initial plasma ignition voltage sufficiently in excess of the oscillation threshold voltage. This secondary power supply "pre-ignites" the plasma so that when the primary power supply is applied, the system smoothly transitions to final plasma development and deposition. This design thereby avoids oscillations when the primary power supply is engaged and disengaged, and any corresponding device damage.

In preferred embodiments, a current limiting resistor, switch, and diode are connected in series between the secondary power supply and the cathode.

The current limiting resistor limits the current flowing from the secondary power supply into the cathode. Only a minimal current is needed to elevate the cathode voltage above the oscillation threshold and pre-ignite the plasma; by interposing a current-limiting resistor, the secondary power supply current is held at this minimum level, thus avoiding the need for a high power secondary supply, and also limiting the plasma current and deposition while the secondary power supply is enabled and the primary supply is disabled.

The diode automatically disconnects the secondary power supply from the cathode when the primary supply begins driving the plasma. To achieve this, the diode is connected so that it is "on", i.e., current flows, when the magnitude of the secondary supply voltage exceeds the cathode voltage, and is "off" otherwise; thus, once the primary supply engages and begins driving the cathode, the diode turns "off" and the secondary supply is disconnected.

The switch is used to turn the secondary power supply voltage on and off; at the beginning of processing, this switch is closed and gas is introduced into the chamber. When the plasma process is completed, the gas flow is stopped, and once vacuum is restored, the switch is opened. Because the switch is opened and closed while the chamber is at full vacuum (when there is very little gas in the chamber), gas/plasma transition oscillations are substantially reduced.

BRIEF DESCRIPTION OF THE DRAWING

The above and further aspects of the invention will be more fully understood with reference to the accompanying drawings, in which.

DESCRIPTION OF THE PREFERRED EMBODIMENTS

Figure 1:
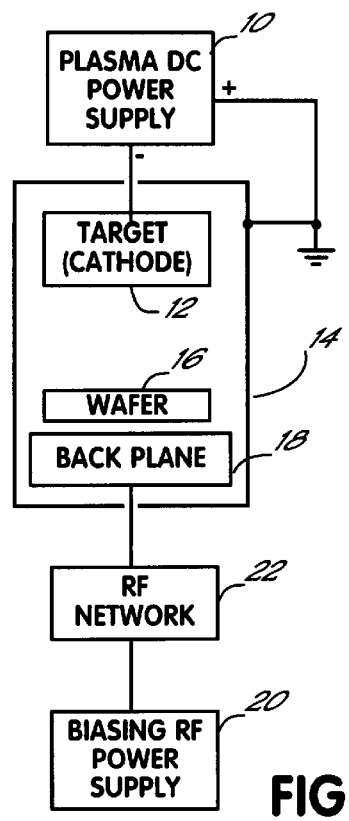
FIG. 1 is a block diagram of a conventional sputter deposition apparatus.
Figure 2:
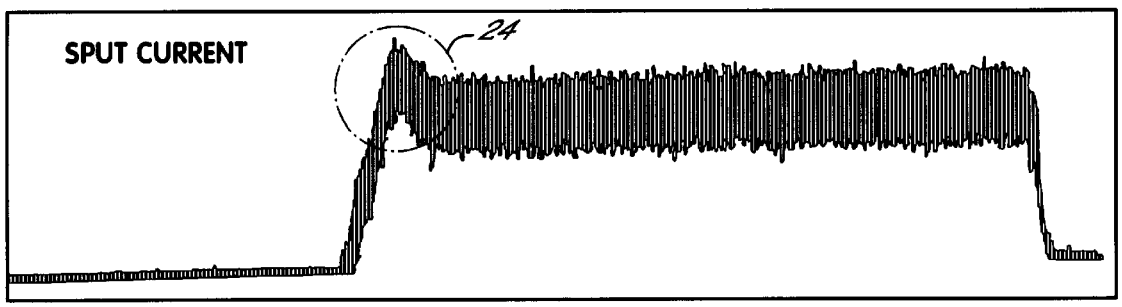
FIG. 2 is a trace of the sputter current measured at power supply 10 of FIG. 1.
Figure 5:
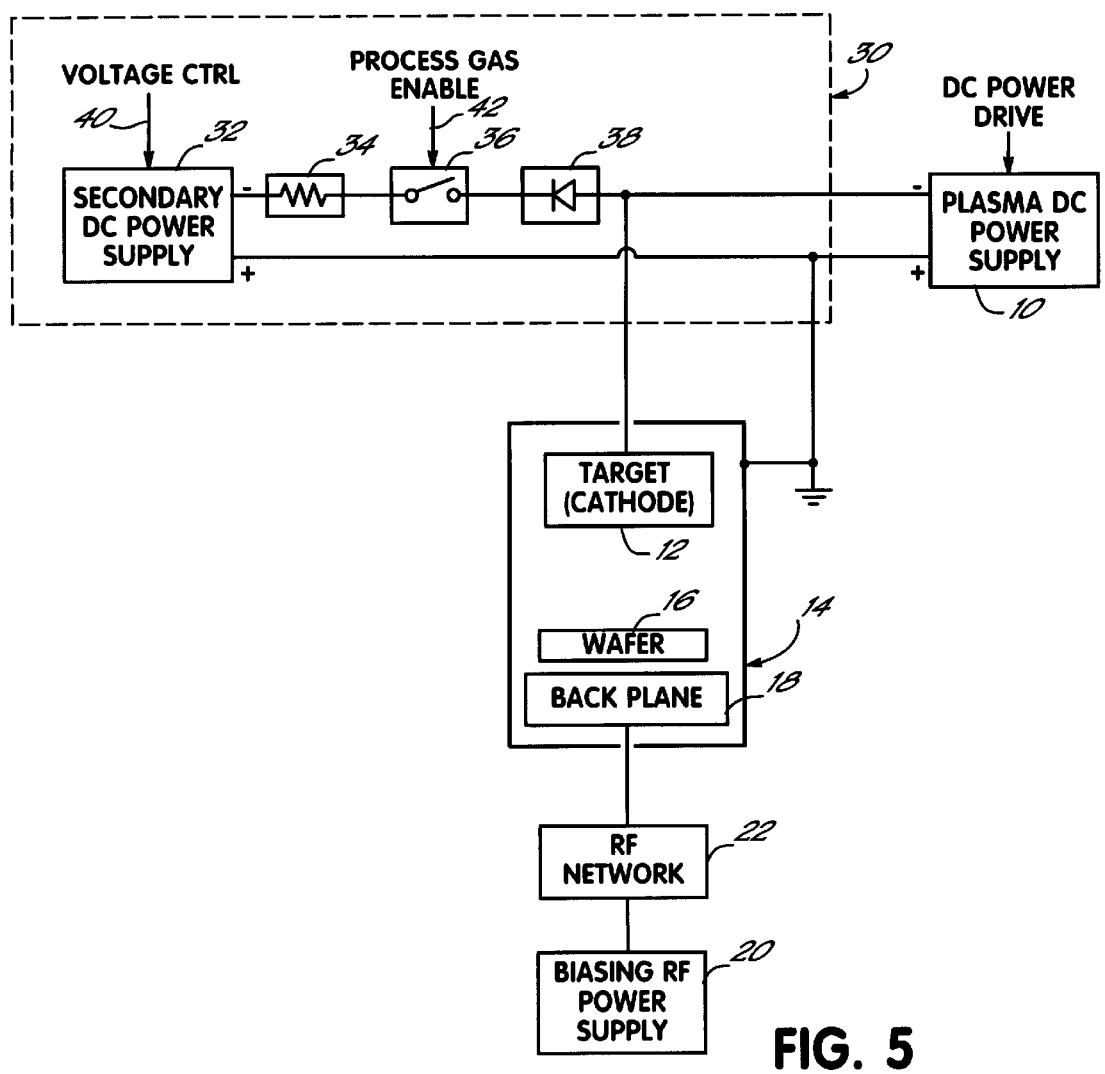
FIG. 5 is a block diagram of a sputter deposition apparatus in accordance with the present invention.

Referring to FIG. 5, in one embodiment of a plasma processing apparatus in accordance with the invention, a plasma ignition circuit 30 is added to the apparatus shown in FIG. 1. Other than circuit 30, the apparatus of FIG. 5 uses the same components as the apparatus of FIG. 1, including a primary DC power supply 10, cathode 12, substrate 16 and back plane 18 within chamber 14, RF power supply 20 and coupling network 22.

Plasma ignition circuit 30 comprises a secondary DC power supply 32 which produces an output voltage greater than the oscillation threshold voltage of chamber 14. The output voltage of secondary supply 32 must be adjusted whenever the oscillation threshold changes, e.g. with every change in the cathode material, process gas and pressure, chamber geometry, electrical characteristics of the external power wiring, and (possibly) the volt-ampere curve of the sputtering chamber. The appropriate output voltage may be determined by monitoring the voltage of the cathode while manually adjusting the power supply voltage, in the manner discussed above with reference to FIG. 4. Through such an experiment, the oscillation threshold voltage can be measured, and a suitable output voltage above the oscillation threshold can be chosen.

Figure 3:
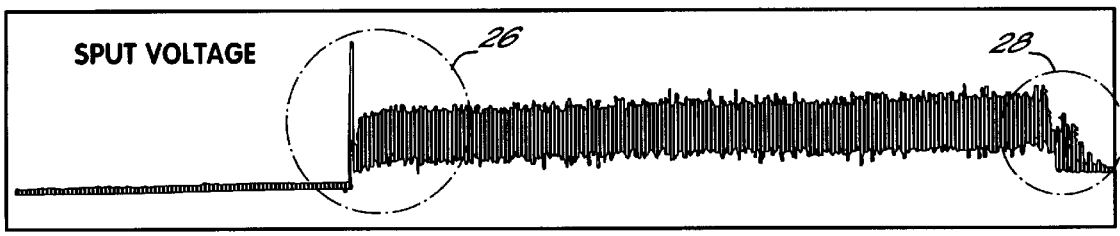
FIG. 3 is a trace of the sputter voltage measured at cathode 12 of FIG. 1.
Figure 4:
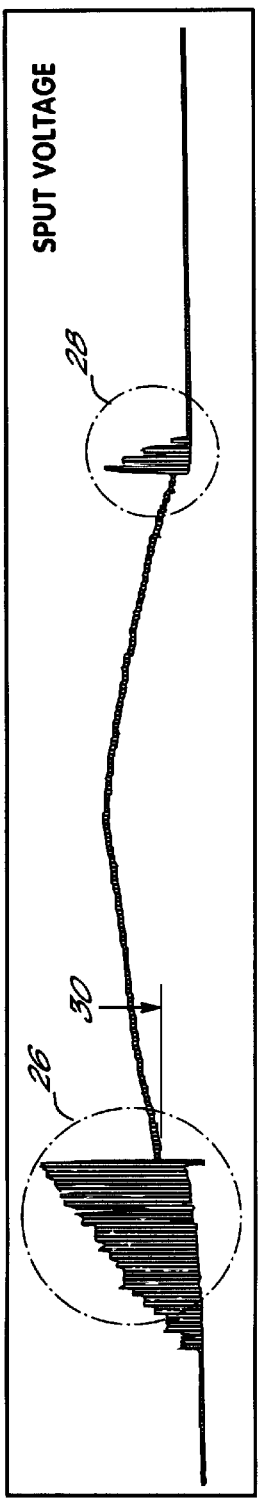
FIG. 4 is a trace of the sputter voltage measured at cathode 12 of FIG. 1, produced by manually adjusting the chamber voltage.

For example, FIG. 4 was generated from experiments using a deposition chamber 14 and a high purity aluminum alloy target 12 sold by Materials Research Corporation of Orangeburg, N.Y. under the trademarks "ECLIPSE M3" and "RMX-10", respectively, in combination with a DC power supply 10 sold by Advanced Energy Industries of Fort Collins, Colo. under the trademark "MDX-10kW". Measurements were recorded by a thermal chart recorder, running at 20 mm/sec. (FIGS. 2, 3, 7 and 8 were generated with similar apparatus.) FIG. 4 was produced under typical operating conditions, e.g.: The gas was sputtering purity argon, at a pressure of 10 mT (at 100 sccm) and a flow rate of 50–150 sccm. DC power supply 10 was set to output 6–10 kW of power. The wafer temperature was approximately 300° C. and the deposition rate was approximately 7000 Å/minute. These values are examplary only and are not critical to the oscillatory pheonomena shown in FIG. 4; for example, oscillations were also seen at ambient temperature. Based on FIG. 4, the oscillation threshold was estimated at just below −300 Volts, so the output voltage of secondary DC supply 32 was set at −300 Volts.

Secondary DC power supply 32 is enabled and disabled by a voltage control signal on line 40, and is connected to cathode 12 through a resistor 34, relay switch 36, and diode 38. The purpose of these elements is discussed below.

Relay 36 connects and disconnects secondary power supply 32 to the cathode. The relay ensures that the voltage transition on the cathode is as rapid as possible. Relay 36 is opened and closed by the signal on line 42. In operation, relay 36 is left open while the chamber 14 is evacuated and secondary supply 32 is enabled (by an appropriate signal on line 40). Then, once the chamber is evacuated and secondary supply 32 has achieved the desired output voltage, relay 36 is closed, causing a cathode 12 to transition te the voltage of secondary supply 32. After the cathode is at the secondary supply voltage, gas is permitted to flow into the chamber, producing a pre-ignited gas plasma. Thereafter, primary supply 10 is enabled to generate plasma current and deposition on wafer 16.

To end processing, primary supply 10 is disabled, reducing the plasma current and deposition on wafer 16. Then, gas flow is terminated and the chamber is fully evacuated. Once the chamber is fully evacuated, relay 36 is opened and the cathode voltage returns to ground. After relay 36 is opened, as desired, secondary supply 32 may be switched off by a signal on line 40.

As noted above, resistor 34 serves as a current-limiter. The design shown in FIG. 5 attempts to separate ignition of the plasma from the initiation of deposition: the secondary supply 32 is used to pre-ignite the plasma, whereas the primary supply 10 is used to generate deposition. To ensure separation of these functions, it is desireable to limit the plasma current (and resulting deposition) generated by the secondary supply 32. The current produced by secondary supply 32 should be the minimum amount necessary to maintain plasma ignition. Resistor 34 provides the needed current-limiting function. During the pre-ignition period when gas is flowing into the chamber and the cathode is at the voltage of the secondary power supply 32, plasma current flows within the chamber 14. However, this current flow causes resistor 34 to develop a voltage drop, reducing the voltage between the cathode and the chamber 14, and thereby reducing the plasma current flow. As a result, although the voltage of secondary supply 32 is sufficient to pre-ignite a plasma in chamber 14, current limiting resistor 34 limits the plasma current after the plasma is ignited. The value of the resistance should be chosen to limit the secondary supply current to a few percent of the sputtering current produced by the primary supply (in the above example, about 200 mA).

Diode 38 serves to isolate the secondary power supply after the primary power supply has initiated deposition.

Diode 38 will permit current flow from cathode 12 and into secondary supply 32, but will not permit reverse current flow from secondary supply 32 into the cathode. (Note that the cathode is driven to a negative voltage by supplies 10 and 32.) When the primary supply 10 is enabled, in order to generate substantial sputtering current, supply 10 must produce a voltage in excess of that produced by secondary supply 32. However, when magnitude of the primary supply voltage exceeds that of the secondary supply, diode 38 turns "off", isolating secondary supply 32 from the cathode and primary supply.

Diode 38 may also prevent undesired voltage drops during deposition. For example, most commercially available plasma power supplies are designed to detect arcing in the chamber during processing, and to automatically suspend output when an arc is detected. Normally, output power is restarted after a brief delay (15–20 msec in the power supply described above). During this delay, the magnitude of the cathode voltage may decrease below the oscillation threshold, resulting in undesirable oscillation. Diode 38 prevents such a result; if the magnitude of the cathode voltage drops below that of the secondary power supply, diode 38 will turn "on", so that secondary power supply will hold the cathode voltage at a sufficient magnitude to maintain plasma ignition, and prevent oscillation when the primary supply power is restarted. Diode 38 similarly prevents the magnitude of the cathode voltage from dropping below the oscillation threshold when primary supply 10 is disabled at the end of sputtering. As a result, the plasma remains ignited until the chamber is evacuated after processing.

Figure 6:
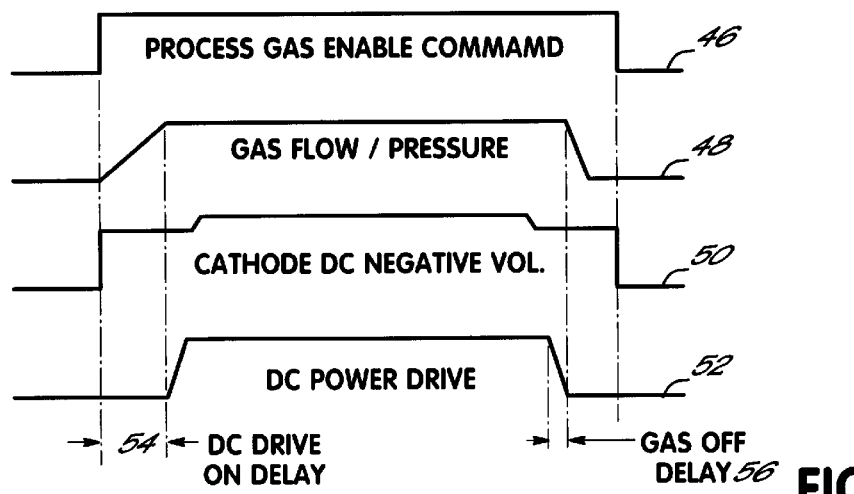
FIG. 6 is a timing diagram useful in understanding the operation of the apparatus of FIG. 5.

The above timing is clarified in FIG. 6. As shown, when processing is initiated, the process gas enable signal on line 42 (trace 46) is raised to a true value (the above-described deposition equipment sold by Materials Research Corporation generates a Process Gas Enable signal which turns on before gas flow starts and remains on until after vacuum is re-established; in the depicted implementation, this signal is used to control relay 36.) At this time, relay 36 closes and secondary supply 32 is connected to the cathode, causing an essentially immediate, step change in the cathode voltage (trace 50) above the oscillation threshold voltage. Sometime thereafter, gas flow is initiated and the gas flow and pressure (trace 48) begin to ramp upwards toward normal processing levels. After a delay time (54), a normal pressure and flow rate are achieved, and primary supply 10 is enabled, causing a ramp increase in the power produced by the primary supply (trace 52). As the primary supply approaches full power, the magnitude of the cathode voltage (trace 50) increases slightly, causing plasma current flow and deposition. This voltage increase also causes diode 38 to turn "off", isolating secondary power supply 32 from the cathode.

At the end of processing, primary supply 10 is disabled, causing a ramp decrease in the power produced by the primary supply (trace 52). As the primary supply power decreases, the magnitude of the cathode voltage (trace 50) decreases to the oscillation threshold, at which point diode 38 turns "on", secondary supply 32 is reconnected to the cathode, and secondary supply 32 holds the cathode above the oscillation threshold voltage. Thereafter, gas flow is turned off, causing the gas flow and pressure (trace 48) to ramp down toward zero. Once vacuum has been re-established, the process gas enable signal (trace 46) is set to false, opening relay 36 and causing a rapid decrease in the magnitude of the cathode voltage (trace 50).

Figure 7:
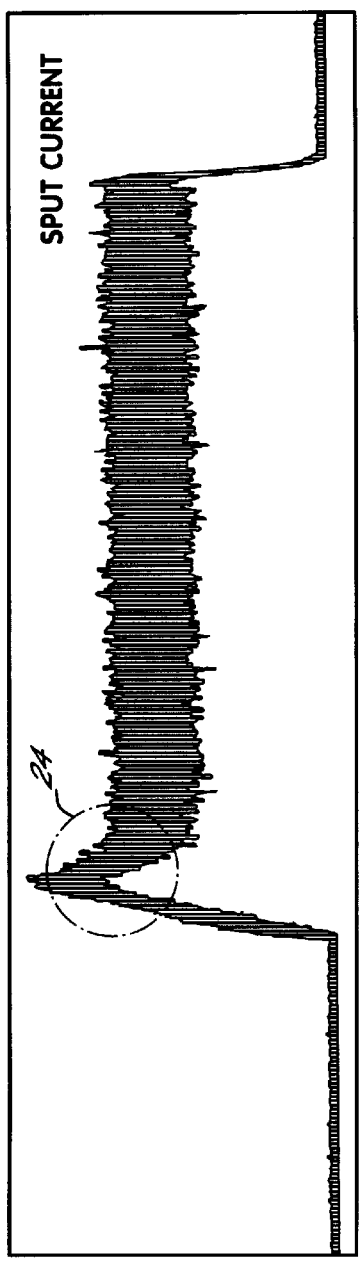
FIG. 7 is a trace of the sputter current measured at the power supply 10 of FIG. 5.
Figure 8:
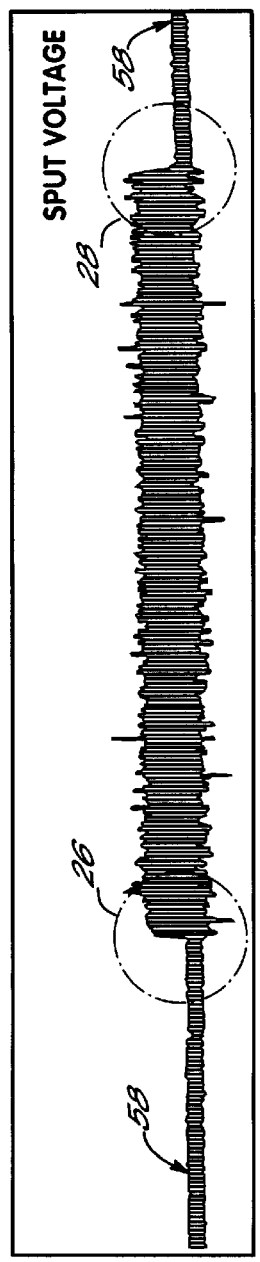
FIG. 8 is a trace of the sputter voltage measured at the cathode 12 of FIG. 5.

As shown in FIGS. 7 and 8, the FIG. 5 design can substantially reduce oscillations at the beginning and end of plasma processing. Although the current behaves in roughly the same manner (compare FIGS. 7 and 2, respectively), the cathode voltage generated by the FIG. 5 design shows no visible oscillations at the beginning and end of processing (regions 26 and 28 of FIG. 8). In the FIG. 1 design, these regions (see FIG. 3) evidenced substantial high voltage spikes.

It should also be noted that the baseline voltage in FIG. 8, i.e., the voltage in regions 58 before and after processing, is approximately −300 Volts DC, rather than approximately 0 Volts DC in the corresponding regions of FIG. 3. This confirms that secondary power supply 32 is holding cathode 14 at a voltage of approximately −300 Volts DC, thereby maintaining ignition of plasma within chamber 14 before and after deposition.

Although the invention has been described with reference to a specific embodiment, it will be understood that various modifications may now be made without departing from the inventive concepts described. For example, the inventive techniques described can be applied to any plasma process, including without limitation to DC (magnetron or non-magnetron) sputtering, RF sputtering, and sputter etching. The specific embodiment described above is to be taken as exemplary and not limiting, with the scope of the claimed invention being determined from the following claims.

What is claimed is:

1. A method of plasma processing a workpiece in a vacuum chamber having a cathode, comprising evacuating said chamber, elevating said cathode to a process initiation voltage relative to said chamber while said chamber is evacuated, said process initiation voltage being insufficient to fully ignite or maintain a plasma within said chamber, flowing a gas into said chamber while maintaining said cathode at said process initiation voltage, and thereafter applying electrical power to said cathode to elevate said cathode to a processing voltage greater than said process initiation voltage to fully ignite a plasma from said gas within said chamber and cause electrical current to flow through said plasma, maintaining said cathode at said processing voltage to maintain ignition of a plasma in said chamber while processing said workpiece within said chamber.

2. The plasma processing method of claim 1 wherein said cathode is elevated to said process initiation voltage by closing a switch and thereby connecting a power supply to said cathode.

3. The plasma processing method of claim 1 wherein electrical power is applied to said cathode by enabling a primary power supply connected to said cathode.

4. The plasma processing method of claim 3 wherein said cathode is elevated to said process initiation voltage by closing a switch and thereby connecting a secondary power supply to said cathode.

5. The plasma processing method of claim 4 wherein said secondary power supply is connected to said cathode via a resistor which limits electrical current flow between said secondary power supply and said cathode.

6. The plasma processing method of claim 5 wherein said secondary power supply is connected to said cathode via a diode which limits electrical current flow between said secondary power supply and said cathode when the magnitude of the voltage of said cathode relative to said chamber exceeds the magnitude of said process initiation voltage.

7. The plasma processing method of claim 4 wherein said secondary power supply is connected to said cathode via a diode which limits electrical current flow between said secondary power supply and said cathode when the magnitude of the voltage of said cathode relative to said chamber exceeds the magnitude of said process initiation voltage.

* * * * *